US006300036B1

(12) United States Patent
Choi et al.

(10) Patent No.: US 6,300,036 B1
(45) Date of Patent: *Oct. 9, 2001

(54) PHOTOSENSITIVE POLYMERS AND CHEMICALLY AMPLIFIED PHOTORESIST COMPOSITIONS USING THE SAME

(75) Inventors: Sang-Jun Choi; Yool Kang, both of Kyunggi-do; Dong-Won Jung, Seoul; Chun-Geun Park, Kyunggi-do, all of (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/203,669

(22) Filed: Dec. 1, 1998

Related U.S. Application Data

(63) Continuation of application No. 08/805,212, filed on Feb. 27, 1997, now Pat. No. 6,103,845.

(30) Foreign Application Priority Data

Oct. 11, 1996 (KR) .................................................. 96-45396
Dec. 2, 1997 (KR) .................................................. 97-65115

(51) Int. Cl.[7] ...................................................... B03F 7/004
(52) U.S. Cl. ........................ 430/270.1; 430/910; 526/271
(58) Field of Search ................................. 430/270.1, 910, 430/905, 522; 526/262

(56) References Cited

U.S. PATENT DOCUMENTS

| 3,280,080 |   | 10/1966 | Potter et al. . |
| 5,372,912 |   | 12/1994 | Allen et al. . |
| 5,843,624 | * | 12/1998 | Houlihan et al. ..................... 430/296 |
| 5,876,899 | * | 3/1999 | Szmanda et al. ................. 430/270.1 |
| 5,879,857 | * | 3/1999 | Chandross et al. ............... 430/270.1 |
| 6,103,450 | * | 8/2000 | Choi ................................. 430/270.1 |
| 6,103,845 | * | 6/2000 | Choi et al. ........................... 526/271 |
| 6,171,754 | * | 1/2001 | Choi et al. ........................ 430/270.1 |

FOREIGN PATENT DOCUMENTS

10130340 * 5/1998 (JP) .

OTHER PUBLICATIONS

Sang–Jun Choi et al. "Novel Single–Layer Chemically Amplified Resist for 193–NM Lithography", SPIE vol. 3049, pp. 104–112, Jul. 1997.

* cited by examiner

Primary Examiner—Janet Baxter
Assistant Examiner—Yvette M. Clarke
(74) Attorney, Agent, or Firm—Jones Volentine, P.L.L.C.

(57) ABSTRACT

The compounds are of a class of photosensitive polymers for use in chemically amplified photoresists. These photoresists produce sharp line patterns when exposed with an ArF excimer laser. The polymer composition includes a copolymer and the photoresist composition includes a terpolymer with a photo acid generator. The resulting chemically amplified photoresist compositions have strong resistance to dry etching, possess excellent adhesion to film material, and are capable of being developed using conventional developers.

13 Claims, 2 Drawing Sheets

PHOTOSENSITIVE POLYMERS AND CHEMICALLY AMPLIFIED PHOTORESIST COMPOSITIONS USING THE SAME

This application is a Continuation of U.S. Ser. No. 08/805,212, now U.S. Pat. No. 6,103,845 A filed Feb. 27, 1997, the disclosure which is incorporated herein by reference in its entirety.

BACKGROUND OF THE INVENTION

1. Field of the Invention

The present invention relates to photosensitive polymers used in chemically amplified photoresist compositions, and photoresist compositions including such polymers.

2. Description of the Related Art

With increasing integration of semiconductor devices, there is a heightened need in photolithography for photoresists that form a fine pattern line of less than 0.25 μm. Photolithography technology has now been developed that can be used with an ArF excimer laser (e.g., λ=193 nm) to fabricate semiconductor devices having more than a 1 gigabit capacity. This technology is intended to replace the conventional KrF excimer lasers which expose photoresist films using deep ultraviolet rays (λ=248 nm). It is therefore desirable to develop new chemically amplified photoresist compositions that produce a fine pattern line of less than 0.25 μm when exposed using an ArF excimer laser.

Chemically amplified photoresist compositions for use with an ArF excimer laser should possess the following qualities:

(1) excellent transmittance in the range of 193 nm;
(2) excellent thermal characteristics, such as for example, a high glass transition temperature (Tg), and a thermal decomposition temperature (Td) higher than its Tg so that the photoresist can be baked to a temperature that is above the (Tg) before being exposed in order to vaporize unwanted organic solvents and to make the photoresist film hard, without causing the photoresist to decompose;
(3) excellent adhesion to film materials;
(4) excellent resistance to dry etching; and
(5) the capability of being developed using conventional alkaline developers, such as 2.38 weight percent (wt %) tetramethylammonium hydroxide(TMAH).

One example of a polymer that has been reported to possess the above properties is the photosensitive terpolymer poly(MMA-tBMA-MAA) which is represented by the following chemical formula:

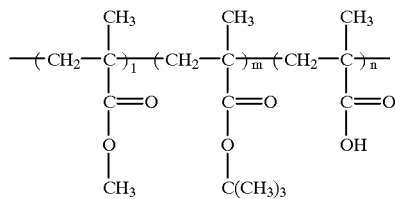

However, poly(MMA-tBMA-MAA) is not an ideal polymer for making photoresist compositions because it has a very weak resistance to dry etching, it has weak adhesive properties, and a special developer is needed. Methacrylate polymers are generally used in the photoresist resist materials for photolithography processes that use an ArF excimer laser. However, such polymers have a very weak resistance to dry etching. To increase resistance to dry etching, a polymer having a backbone composed of an alicyclic compound such as an isobornyl group, an adamantyl group, or a tricyclodecanyl group is used. These conventional polymers, however still exhibit weak resistance to dry etching. They also have inadequate adhesion characteristics, which means that a resist layer formed using the polymer may lift from the underlying layer, thus forming a photoresist pattern that is not sharp enough. These polymers also require special developers.

SUMMARY OF THE INVENTION

An object of the present invention is to provide photosensitive polymers for use in chemically amplified photoresists which may be exposed using ArF lasers. The photoresists must have strong resistance to dry etching, possess excellent adhesion to film materials, and be capable of being developed using conventional developers known to those skilled in the art.

It is another objective of the present invention to provide photoresist compositions containing these photosensitive polymers that are suitable for use in photolithography processes that use the ArF excimer laser.

It is a further object of the invention to provide chemically amplified photoresists containing such photosensitive polymers.

These and other objects of the present invention are provided by photosensitive polymers for use in chemically amplified photoresists. In a first embodiment, the invention provides copolymers for use in chemically amplified photoresists. The copolymers are of the general chemical formula(CFI):

chemical formula (I)

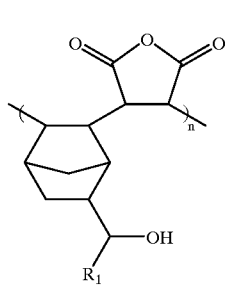

In the above (CFI), $R_1$ is selected from the group including hydrogen and $C_1$ to $C_{20}$ aliphatic hydrocarbons; and n represents an integer. In a preferred embodiment, $R_1$ is one selected from the group including methyl, ethyl, n-butyl, and cyclohexyl. In another preferred embodiment $R_1$ is selected from the group including $C_7$ to $C_{20}$ alicyclic aliphatic hydrocarbons including adamantyl, norbornyl, or isobornyl groups. The copolymers of the present invention have a weight average molecular weight ranging from about 3,000 to about 100,000.

In another aspect, the invention provides a photoresist composition including terpolymers and photo acid generators. The terpolymers are of the chemical formula (CFII):

chemical formula (II)

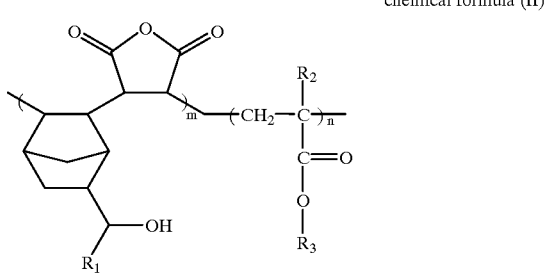

In the above (CFII), $R_1$ is selected from the group including hydrogen and $C_1$ to $C_{20}$ aliphatic hydrocarbons; $R_2$ is hydrogen or a methyl group; $R_3$ is a t-butyl or tetrahydropyranyl group; and n and m are integers. The ratio of n/(m+n) is from about 0.1 to about 0.5. In a preferred embodiment, $R_1$ is one selected from the group including methyl, ethyl, n-butyl, and cyclohexyl. In an alternative embodiment $R_1$ is selected from the group including $C_7$ to $C_{20}$ alicyclic aliphatic hydrocarbons including adamantyl, norbornyl, or isobornyl groups. The terpolymers have a weight average molecular weight ranging from about 3,000 to about 200,000.

Photo acid generators (PAGs) are present in a photoresist composition in amounts ranging from about 1.0 wt % to 20.0 wt % based upon the weight of the terpolymers. In a preferred embodiment, the photo acid generators are one selected from the group including triarylsufonium salts, diaryliodonium salts, sulfonates and mixtures thereof. In another preferred embodiment, the triarylsulfonium salt is one selected from the group including triphenylsulfonium triflate, triphenylsulfonium antimonate, 2,6-dinitrobenzyl sulfonates, and pyrogallol tris(alkylsulfonate). The diaryliodonium salt is one selected from the group including diphenyliodonium triflate, diphenyliodonium antimonate, methoxydiphenyliodonium triflate, di-t-butyldiphenyliodonium triflate, or mixtures thereof.

BRIEF DESCRIPTION OF THE DRAWINGS

The accompanying drawings illustrate embodiments of the invention, in which.

DETAILED DESCRIPTION

Figure 1:
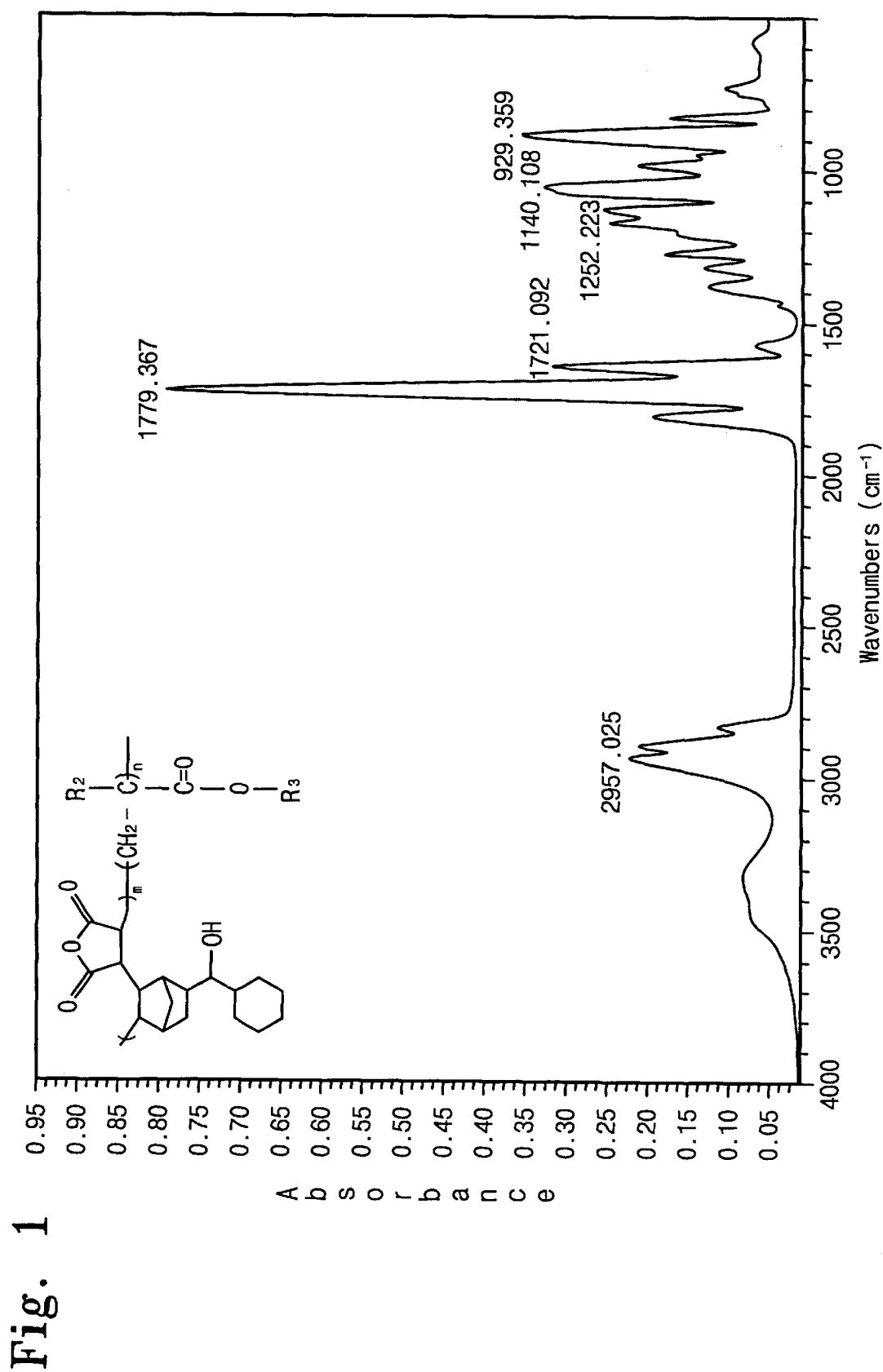
FIG. 1 is a Fourier Transform Infrared (FTIR) spectrum of a photosensitive terpolymer containing t-butyl methacrylate (tBMA) for use in photoresist compositions that produce a fine line pattern when exposed with an ArF excimer laser.

The photosensitive polymers and photoresist compositions according to the present invention will be hereinafter described in detail with reference to FIG. 1 and FIG. 2, and according to the following nonlimiting examples.

EXAMPLE 1

Synthesis of Monomer (a) Synthesis of 5-norbornene-2-cyclohexylmethanol

To synthesise 5-norbornene-2-cyclohexylmethanol, a solution of 13 grams (0.1 mol) 5-norbornene-2-carboxaldehyde was slowly dropped into a solution of 0.1 mol of cyclohexyl magnesium bromide which had been dissolved in diethylether to form a reaction product. The reaction product was refluxed for about 12 hours. After the reaction was complete, the reaction product was poured into an excess amount of water to which diethyl ether was added to extract the reaction product. After drying the reaction product with a magnesiumsulfate solution, the 5-norbornene-2-cyclohexylmethanol was obtained through vacuum distillation.

(b) Synthesis of 5-norbornene-2-norbornylmethanol

In this embodiment, a solution of 13 grams (0.1 mol) 5-norbornene-2-carboxaldehyde was slowly dropped into a solution of 0.1 mol of 2-norbornyl magnesium bromide which had been dissolved in tetrahydrofuran (THF) to form a reaction product. The reaction product was then refluxed for about 20 hours, and the THF was evaporated using a rotary evaporator. The reaction product was then dissolved in an excess amount of water to which diethyl ether was added to extract the reaction product. After drying the reaction product with a magnesiumsulfate solution, the 5-norbornene-2-norbornylmethanol was obtained through vacuum distillation.

(c) Synthesis of tetrahydropyranyl methacrylate

In this embodiment, 0.1 mol of methacrylic acid and 8.6 grams (0.11 mol) of 3,4-dihydro-2H-pyran was dissolved in 150 ml of $CH_2Cl_2$. Small amounts of p-toluene sulfonic acid were then added to the resultant solution. The resultant solution was allowed to react at room temperature for four hours to form a reaction product. Then, the reaction product was dissolved in an excess amount of water to which diethyl ether was added to extract the reaction product. After drying the reaction product with a magnesiumsulfate solution, tetrahydropyranyl methacrylate was obtained through vacuum distillation.

EXAMPLE 2

Synthesis of copolymer

The synthesis reaction of the copolymer according to this embodiment can be represented by the following reaction formula (RFI):

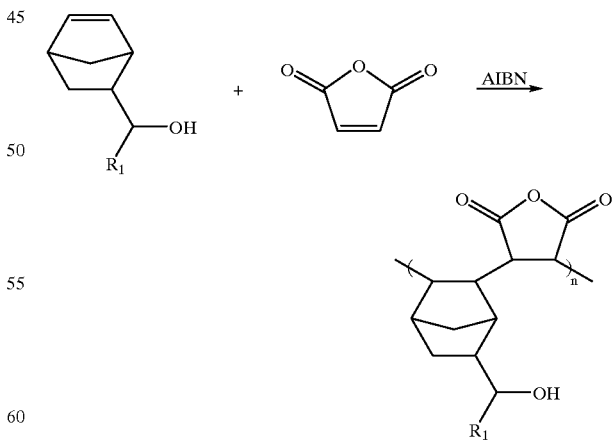

(a) Synthesis of poly(norbornene-2-cyclohexylmethanol-alt-maleic anhydride)

20 grams (0.1 mol) of 5-norbornene-2-cyclohexylmethanol and 10 grams (0.1 mol) of maleic anhydride were dissolved in 100 ml of THF. 0.32 grams of AIBN (2,2'-azobisisobutyronitrile) were then added to the solution. The mixture was purged for about 1 hour using $N_2$ gas.

The mixture was then refluxed for about 24 hours and subsequently the reaction product was precipitated in n-hexane diluted one part reaction mixture to ten parts n-hexane. Next, the precipitate was dissolved in THF again, and reprecipitated in n-hexane as described above. The resultant precipitate was filtered and then dried in a vacuum oven at 50° C. for about 24 hours to produce the poly(norbornene-2-cyclohexylmethanol-alt-maleic anhydride). The yield was 60%. The weight average molecular weight of the thus obtained copolymer was 5000 and polydispersity (weight average molecular weight/number average molecular weight) was 2.1. The result of the FTIR spectrum analysis for the thus obtained copolymer product was as follows:

FTIR(KBr):3400 to 3600 $cm^{-1}$ (—O—H), 1782 $cm^{-1}$ (C=O).

(b) Synthesis of poly(norbornene-2-norbornylmethanol-alt-maleic anhydride)

In this embodiment, 21 grams (0.1 mol) of 5-norbornene-2-norbornylmethanol and 10 grams (0.1 mol) of maleic anhydride were dissolved in 100 ml of THF, and 0.32 grams of AIBN (2,2'-azobisisobutyronitrile) was added thereto. The mixture was completely purged for 1 hour with nitrogen gas.

The reaction product was refluxed for about 24 hours and then precipitated in n-hexane diluted one part reaction mixture to ten parts n-hexane. After that, the precipitate was dissolved in THF again, and then reprecipitated in n-hexane as described above. The resultant precipitate was filtered and then dried in a vacuum oven at 50° C. for about 24 hours to obtain poly(norbornene-2-norbornylmethanol-alt-maleic anhydride). The yield was 65%. The weight average molecular weight of copolymer was 4700 and polydispersity (weight average molecular weight/number average molecular weight) was 2.0.

The result of the FTIR spectrum analysis for poly(norbornene-2-norbornylmethanol-alt-maleic anhydride) was as follows:

FTIR(KBr):3400 to 3600 $cm^{-1}$ (—O—H), 1780 $cm^{-1}$ (C=O).

EXAMPLE 3

Synthesis of terpolymer

The synthesis reaction of the terpolymer according to this embodiment can be represented by the following reaction formula II (RFII):

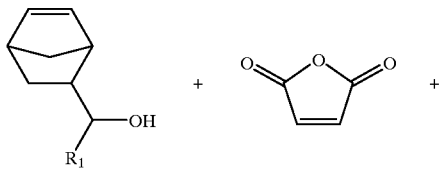

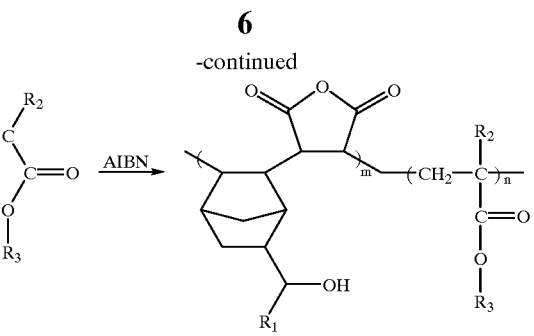

(a) Synthesis of terpolymer wherein $R_3$ is t-butyl group

In this embodiment, 20 grams (1.0 mol) of 5-norbornene-2-cyclohexylmethanol, 10 grams (0.1 mol) of maleic anhydride, and 14 grams (0.1 mol) of t-butyl methacrylate (t-BMA) were dissolved in 150 ml of THF; 0.49 grams of AIBN were then added thereto. The mixture was completely purged for 1 hour with nitrogen gas.

The reaction product was fluxed for about 24 hours and subsequently precipitated in n-hexane diluted one part reaction mixture to ten parts n-hexane. Next, the precipitate was dissolved in THF again, and reprecipitated in n-hexane as described above. The resultant precipitate was filtered and then dried in a vacuum oven at 50° C. for about 24 hours to obtain poly(norbornene-2-norbornylmethanol-alt-maleic anhydride) (tBMA). The yield was 75%. The weight average molecular weight of the copolymer was 5500 and polydispersity (weight average molecular weight/number average molecular weight) was 2.1.

FIG. 1 represents a Fourier Transform Infrared (FTIR) spectrum of the terpolymer tBMA prepared according to this embodiment. The result of the FTIR spectrum analysis shown in FIG. 1 was as follows:

FTIR(KBr):3400 to 3600 $cm^{-1}$ (—O—H), 2789 $cm^{-1}$ (C—H), 1780 $cm^{-1}$(C=O).

(b) Synthesis of terpolymer wherein $R_3$ is a tetrahydropyranyl group

In this embodiment, 20 grams (0.1 mol) of 5-norbornene-2-cyclohexylmethanol, 10 grams (0.1 mol) of maleic anhydride, and 17 grams (0.1 mol) of tetrahydropyranyl methacrylate (THPMA) were dissolved in 150 ml of THF; 0.49 grams of AIBN were then added thereto. The mixture was completely purged for 1 hour with nitrogen gas.

The reaction product was refluxed for about 24 hours and subsequently precipitated an excess amount of n-hexane diluted one part reaction mixture to ten parts n-hexane. Next, the precipitate was dissolved in THF again, and reprecipitated in n-hexane as described above. The resultant precipitate was filtered and then dried in a vacuum oven at 50° C. for about 24 hours to obtain poly(norbornene-2-norbornylmethanol-alt-maleic anhydride). The yield was 75%. The weight average molecular weight of the thus obtained copolymer was 5000 and polydispersity (weight average molecular weight/number average molecular weight) was 2.0.

The result of the FTIR spectrum analysis for the thus obtained copolymer product was as follows:

FTIR(KBr):3400 to 3600 $cm^{-1}$ (—O—H), 2957 $cm^{-1}$ (C—H), 1780 $cm^{-1}$(C=O), 1720 $cm^{-1}$(C=O).

EXAMPLE 4

Photoresist Composition (a) Photoresist Composition with Terpolymer Having t-butyl Group In this embodiment, 1.0 grams terpolymer having t-BMA prepared as in Example 3 and 0.05 grams of triphenylsulfonium triflate were completely dissolved in 6.0 grams of Propylene glycol monomethyl ether acetate (PGMEA). After that, the resultant solution was filtered through a 0.45 µm filter and then filtered again through a 0.2 µm microfilter to obtain a photoresist solution.

Next, the resist composition was applied to a silicon wafer treated with hexamethyldisilazane (HMDS) to form a coating film having a thickness of about 0.5 µm on the wafer.

The wafer having the coated photoresist film thereon was then pre-baked at a temperature of about 130° C. for about 90 seconds and exposed to light using a ArF excimer laser having a numerical aperture of 0.45. Then, a post-exposure baking (PEB) was performed at a temperature of about 140° C. for about 90 seconds.

The resultant material was developed using 2.38 weight percent (wt %) of TMAH solution for about 60 seconds. A clean line and a very fine space pattern having a width of 0.30 µm was obtained using an exposure dose of about 25 mJ/cm$^2$.

Figure 2:
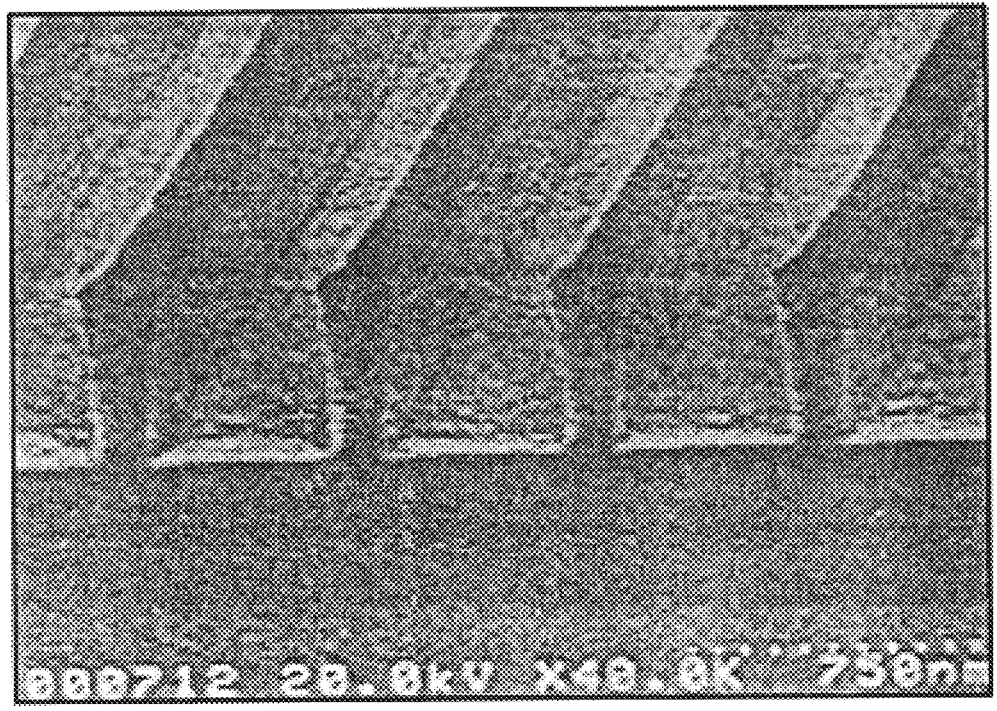
FIG. 2 is a cross-sectional photograph of a 0.3 μm line and space pattern for the chemically amplified photoresists according to the present invention.

FIG. 2 is a cross-sectional photograph of 0.3 µm line and space pattern obtained using the photoresist composition prepared according to the procedure set forth in Example 4. FIG. 2 shows the 0.3 µm line and space pattern using the photoresist composition prepared according to the procedure set forth in Example 4 when the exposure energy was approximately 25mJ/cm$^2$.

(b) Photoresist Composition with Terpolymer Having Tetrahydropyranyl Group

In this embodiment, 1.0 grams terpolymer having THPMA as prepared in Example 3 and 0.05 grams of triphenylsulfonium triflate were completely dissolved in 6.0 grams of Propylene glycol monomethyl ether acetate (PGMEA). After that, the resultant solution was filtered through a 0.45 µm and then filtered again through a 0.2 µm microfilter to prepare a photoresist solution.

Next, the photoresist composition was applied to a silicon wafer treated with hexamethyldisilazane (HMDS) to form a coating film having a thickness of about 0.5 µm on the wafer.

The wafer having the coated photoresist film thereon was then pre-baked at a temperature of about 100° C. for about 90 seconds and exposed to light using a ArF excimer laser having a numerical aperture of 0.45. Then, a post exposure baking (PEB) was performed at a temperature of about 100° C. for about 90 seconds.

The resultant material was developed using 2.38 weight percent (wt %) of TMAH solution for about 60 seconds. A clean line and a very fine space pattern having a width of 0.30 µm was obtained using an exposure dose of approximately 13 mJ/cm$^2$.

(c) Photoresist Composition with Terpolymer Having Tetrahydropyranyl Group

In this embodiment, 1.0 grams terpolymer having THPMA prepared in Example 3 and 0.02 grams of methoxydiphenyliodonium were completely dissolved in 6.0 grams of Propylene glycol monomethyl ether acetate (PGMEA). After that, the resultant solution was filtered through a 0.45 µm and then filtered again through a 0.2 µm microfilter to obtain the photoresist composition.

Next, the resist composition was applied to a silicon wafer treated with hexamethyldisilazane (HMDS) to form a coating film having a thickness of about 0.5 µm on the wafer.

The wafer having the coated photoresist film thereon was then pre-baked at a temperature of about 100° C. for about 90 seconds and exposed to light using a ArF excimer laser having a numerical aperture of 0.60. Then, a post exposure bake (PEB) was performed at a temperature of about 100° C. for about 90 seconds.

Thereafter, the resultant wafer was developed for about 60 seconds using a solution of about 2.38 wt % of tetramethyl ammonium hydroxide (TMAH).

In this embodiment, a 0.3 µm line and space pattern was obtained using the photoresist composition and exposing the resist with an exposure energy of approximately 18 mJ/cm$^2$.

The present invention therefore provides photosensitive polymers that can be used to make chemically amplified photoresist compositions for use with an ArF excimer laser. The photoresist compositions of the present invention have excellent thermal characteristics, transmittance in the range of 193 nm; adhesion to film materials; resistance to dry etching; and they can be developed using conventional alkaline developers, such as tetramethylammonium hydroxide(TMAH).

The present invention is not limited to the embodiments set forth above, and it is clearly understood that many variations may be made within the scope of the present invention by anyone of skill in the art.

What is claimed is:

1. A copolymer for use in a chemically amplified photoresist, represented by the formula(I):

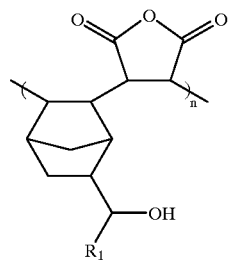

formula (I)

wherein $R_1$ is selected from the group consisting of $C_1$ to $C_{20}$ aliphatic hydrocarbons, and n is an integer.

2. The copolymer according to claim 1, wherein $R_1$ is one selected from the group consisting of methyl, ethyl, n-butyl, and cyclohexyl.

3. The copolymer according to claim 1, wherein $R_1$ is selected from the group consisting of $C_7$ to $C_{20}$ alicyclic aliphatic hydrocarbons.

4. The copolymers of claim 3, wherein the aliphatic hydrocarbons contain a member of the group consisting of an adamantyl, a norbornyl, or an isobornyl group.

5. A photoresist composition comprising:

(a) a photo acid generator and a polymer having the formula(II):

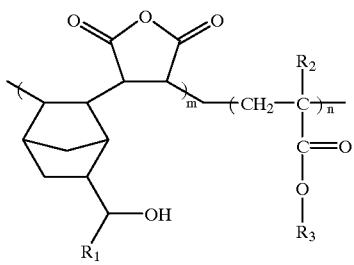

formula (II)

wherein
- $R_1$ is selected from the group consisting of $C_1$ to $C_{20}$ aliphatic hydrocarbons;
- $R_2$ is a hydrogen atom (H) or a methyl ($CH_3$) group;
- $R_3$ is a member selected from the group consisting of t-butyl and tetrahydropyranyl groups;
- n and m are integers; and
- n/(m+n) is in a range of from about 0.1 to about 0.5.

6. The photoresist composition according to claim 5, wherein $R_1$ is a member selected from the group consisting of methyl, ethyl, n-butyl, and cyclohexyl groups.

7. The photoresist composition according to claim 5, wherein $R_1$ is a member selected from the group consisting of $C_7$ to $C_{20}$ alicyclic aliphatic hydrocarbons.

8. The photoresist composition according to claim 7, wherein the $C_7$ to $C_{20}$ alicyclic aliphatic hydrocarbon is a member selected from the group consisting of a adamantyl, a norbornyl, or an isobornyl group.

9. The photoresist composition according to claim 5, wherein the photo acid generator has a weight percent (wt %) in the range of 1.0 to 20 based upon the weight of the polymer.

10. The photoresist composition according to claim 5, wherein said polymer has a weight average molecular weight of from about 3,000 to about 200,000.

11. The photoresist composition according to claim 5, wherein said photo acid generator is a member selected from the group consisting of triarylsufonium salts, diaryliodonium salts, and sulfonates.

12. The photoresist composition according to claim 11, wherein said triarylsulfonium salt is a member selected from the group consisting of triphenylsulfonium triflate, triphenylsulfonium antimonate, 2,6-dinitrobenzyl sulfonates, pyrogallol tris(alkylsulfonate).

13. The photoresist composition according to claim 11, wherein said diaryliodonium salt is a member selected from the group consisting of diphenyliodonium triflate, diphenyliodonium antimonate, methoxydiphenyliodonium triflate, and di-t-butyldiphenyliodonium triflate.

* * * * *